(12) United States Patent
Kokumai

(10) Patent No.: US 11,664,402 B2
(45) Date of Patent: May 30, 2023

(54) SEMICONDUCTOR DEVICE HAVING A TRENCH AND CAMERA WITH SEMICONDUCTOR DEVICE

(71) Applicant: CANON KABUSHIKI KAISHA, Tokyo (JP)

(72) Inventor: Kazuo Kokumai, Atsugi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/810,054

(22) Filed: Mar. 5, 2020

(65) Prior Publication Data

US 2020/0203402 A1 Jun. 25, 2020

Related U.S. Application Data

(63) Continuation of application No. 15/267,626, filed on Sep. 16, 2016, now abandoned, which is a (Continued)

(30) Foreign Application Priority Data

Apr. 8, 2013 (JP) ................................ 2013-080836

(51) Int. Cl.
*H01L 27/146* (2006.01)

(52) U.S. Cl.
CPC ...... *H01L 27/1463* (2013.01); *H01L 27/1464* (2013.01); *H01L 27/14687* (2013.01);
(Continued)

(58) Field of Classification Search
CPC .......... H01L 27/1463; H01L 27/14687; H01L 27/14689; H01L 27/1464; H01L 27/14645;
(Continued)

(56) References Cited

U.S. PATENT DOCUMENTS 7,078,779 B2 7/2006 Wang et al.
7,518,144 B2 4/2009 Hirata et al.
(Continued)

FOREIGN PATENT DOCUMENTS

JP 60-021540 A 2/1985
JP 2-214159 A 8/1990
(Continued)

OTHER PUBLICATIONS

Notification of Reasons for Refusal in Japanese Patent Application No. 2013-080836 (dated Mar. 17, 2017).

*Primary Examiner* — Nelson Garces
(74) *Attorney, Agent, or Firm* — Venable LLP

(57) ABSTRACT

A method of manufacturing a semiconductor device, includes forming a trench in a semiconductor substrate having a first face and a second face by processing the first face of the semiconductor substrate, the trench including a first portion and a second portion located between the first portion and a plane including a first face, filling an insulator in the second portion such that a space remains in the first portion and the trench is closed, and forming a plurality of elements between the first face and the second face, wherein the space and the insulator form element isolation.

23 Claims, 8 Drawing Sheets

Related U.S. Application Data continuation of application No. 14/224,288, filed on Mar. 25, 2014, now Pat. No. 9,508,768.

(52) U.S. Cl.
CPC .. *H01L 27/14689* (2013.01); *H01L 27/14621* (2013.01); *H01L 27/14627* (2013.01); *H01L 27/14636* (2013.01); *H01L 27/14645* (2013.01)

(58) Field of Classification Search
CPC ......... H01L 27/14636; H01L 27/14621; H01L 27/14627
See application file for complete search history.

(56) References Cited

U.S. PATENT DOCUMENTS

| | | | |
|---|---|---|---|
| 7,816,752 B2 | 10/2010 | Mori | |
| 8,569,839 B2 | 10/2013 | Morii et al. | |
| 8,749,679 B2 | 6/2014 | Shinohara | |
| 8,835,981 B2 | 9/2014 | Oishi | |
| 8,884,319 B2 | 11/2014 | Kunikiyo | |
| 9,048,158 B2 | 6/2015 | Kunikiyo | |
| 9,337,230 B2 | 5/2016 | Shinohara | |
| 9,564,467 B2 | 2/2017 | Shinohara | |
| 2007/0194356 A1* | 8/2007 | Moon | H01L 27/1463 257/291 |
| 2007/0235783 A9 | 10/2007 | Sandhu et al. | |
| 2009/0200625 A1 | 8/2009 | Venezia et al. | |
| 2010/0144114 A1 | 6/2010 | Enichlmair et al. | |
| 2011/0031576 A1 | 2/2011 | Iwasa et al. | |
| 2011/0249163 A1 | 10/2011 | Ikeda et al. | |
| 2011/0266645 A1 | 11/2011 | Chao et al. | |
| 2012/0001291 A1 | 1/2012 | Kokumai | |
| 2012/0033119 A1 | 2/2012 | Shinohara | |
| 2012/0153128 A1 | 6/2012 | Roy et al. | |
| 2012/0199893 A1 | 8/2012 | Okabe et al. | |
| 2013/0069190 A1 | 3/2013 | Kao et al. | |
| 2013/0214374 A1 | 8/2013 | Kokumai | |
| 2013/0248862 A1* | 9/2013 | Inoue | H01L 31/0224 257/432 |
| 2013/0285181 A1 | 10/2013 | Lin et al. | |
| 2013/0307040 A1* | 11/2013 | Ahn | H01L 27/1463 257/292 |
| 2013/0320419 A1 | 12/2013 | Jangjian et al. | |
| 2014/0078310 A1 | 3/2014 | Velichko et al. | |
| 2014/0239362 A1 | 8/2014 | Koo et al. | |
| 2015/0243694 A1 | 8/2015 | Ihara | |
| 2016/0064480 A1 | 3/2016 | Sandhu et al. | |

FOREIGN PATENT DOCUMENTS

| | | |
|---|---|---|
| JP | 11-017002 A | 1/1999 |
| JP | 2004-228407 A | 8/2004 |
| JP | 2005-123449 A | 5/2005 |
| JP | 2006-344644 A | 12/2006 |
| JP | 2007-227761 A | 9/2007 |
| JP | 2009-503814 A | 1/2009 |
| JP | 2009-147211 A | 7/2009 |
| JP | 2009-182223 A | 8/2009 |
| JP | 2011-023470 A | 2/2011 |
| JP | 2011-040543 A | 2/2011 |
| JP | 2011-119558 A | 6/2011 |
| JP | 2011-151121 A | 8/2011 |
| JP | 2012-015316 A | 1/2012 |
| JP | 2012-028790 A | 2/2012 |
| JP | 2012-038981 A | 2/2012 |
| JP | 2012-178429 A | 9/2012 |
| WO | 2007/011566 A1 | 1/2007 |

* cited by examiner

SEMICONDUCTOR DEVICE HAVING A TRENCH AND CAMERA WITH SEMICONDUCTOR DEVICE

CROSS-REFERENCE TO RELATED APPLICATIONS

This application is a continuation of U.S. patent application Ser. No. 15/267,626, filed Sep. 16, 2016, which is a continuation of U.S. patent application Ser. No. 14/224,288, filed Mar. 25, 2014, now U.S. Pat. No. 9,508,768, which claims the benefit of Japanese Patent Application No. 2013-080836, filed Apr. 8, 2013. The entire contents of these prior applications are incorporated herein by reference.

BACKGROUND OF THE INVENTION

Field of the Invention

The present invention relates to a semiconductor device and a method of manufacturing the same.

Description of the Related Art

Japanese Patent Laid-Open No. 2012-15316 describes a method of manufacturing a semiconductor device such as a solid-state image sensor. In this method, a structure in which a plurality of single-crystal silicon layers each including a semiconductor element such as a photodiode are separated by gaps is prepared, and a light-shielding film such as a tungsten film, a planarizing layer, color filters, and microlenses are formed on the plurality of single-crystal silicon layers.

In the method described in Japanese Patent Laid-Open No. 2012-15316, the light-shielding film such as a tungsten film is formed on the plurality of single-crystal silicon layers without filling the gaps formed between the plurality of single-crystal silicon layers. Accordingly, a conductive film as the light-shielding film may be formed in the gaps. Also, the degree of the formation of the light-shielding film in the gaps may change in accordance with a position in a substrate, or may change from one substrate to another. This may produce variations in characteristics of semiconductor devices such as solid-state image sensors.

SUMMARY OF THE INVENTION

The present invention provides a technique advantageous in reducing variations in a plurality of spaces formed for element isolation in a semiconductor device.

One of the aspects of the present invention provides a method of manufacturing a semiconductor device, comprising: forming a trench in a semiconductor substrate having a first face and a second face by processing the first face of the semiconductor substrate, the trench including a first portion and a second portion located between the first portion and a plane including a first face; filling an insulator in the second portion such that a space remains in the first portion and the trench is closed; and forming a plurality of elements between the first face and the second face, wherein the space and the insulator form element isolation.

Further features of the present invention will become apparent from the following description of exemplary embodiments with reference to the attached drawings.

DESCRIPTION OF THE EMBODIMENTS

The present invention will be explained below by way of its exemplary embodiments with reference to the accompanying drawings. Note that an example in which the present invention is applied to a solid-state image sensor will be explained below, but one aspect of the present invention has features in the structure of element isolation and a method of manufacturing the same. Accordingly, this aspect of the present invention is also applicable to a semiconductor device other than the solid-state image sensor.

Figure 1:
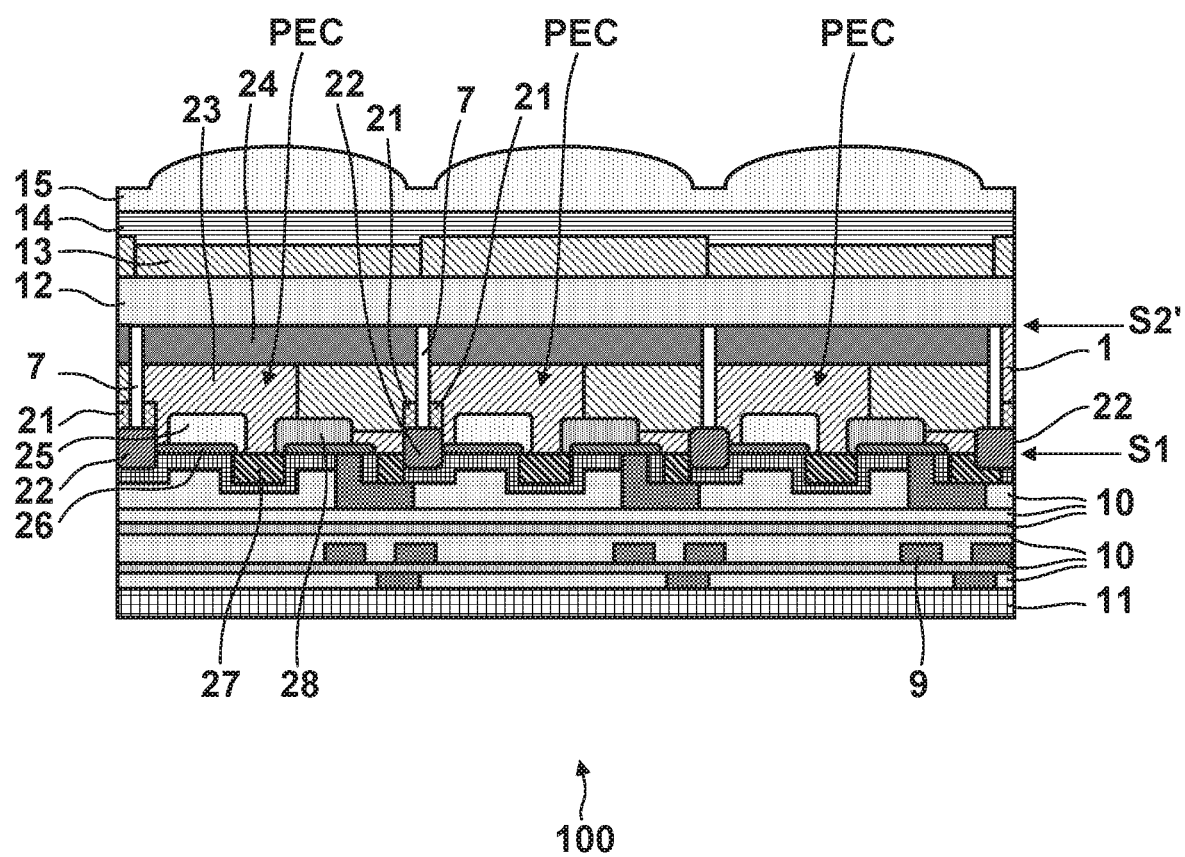
FIG. 1 is a sectional view showing a portion of a pixel array of a solid-state image sensor of the first embodiment.
Figure 2:
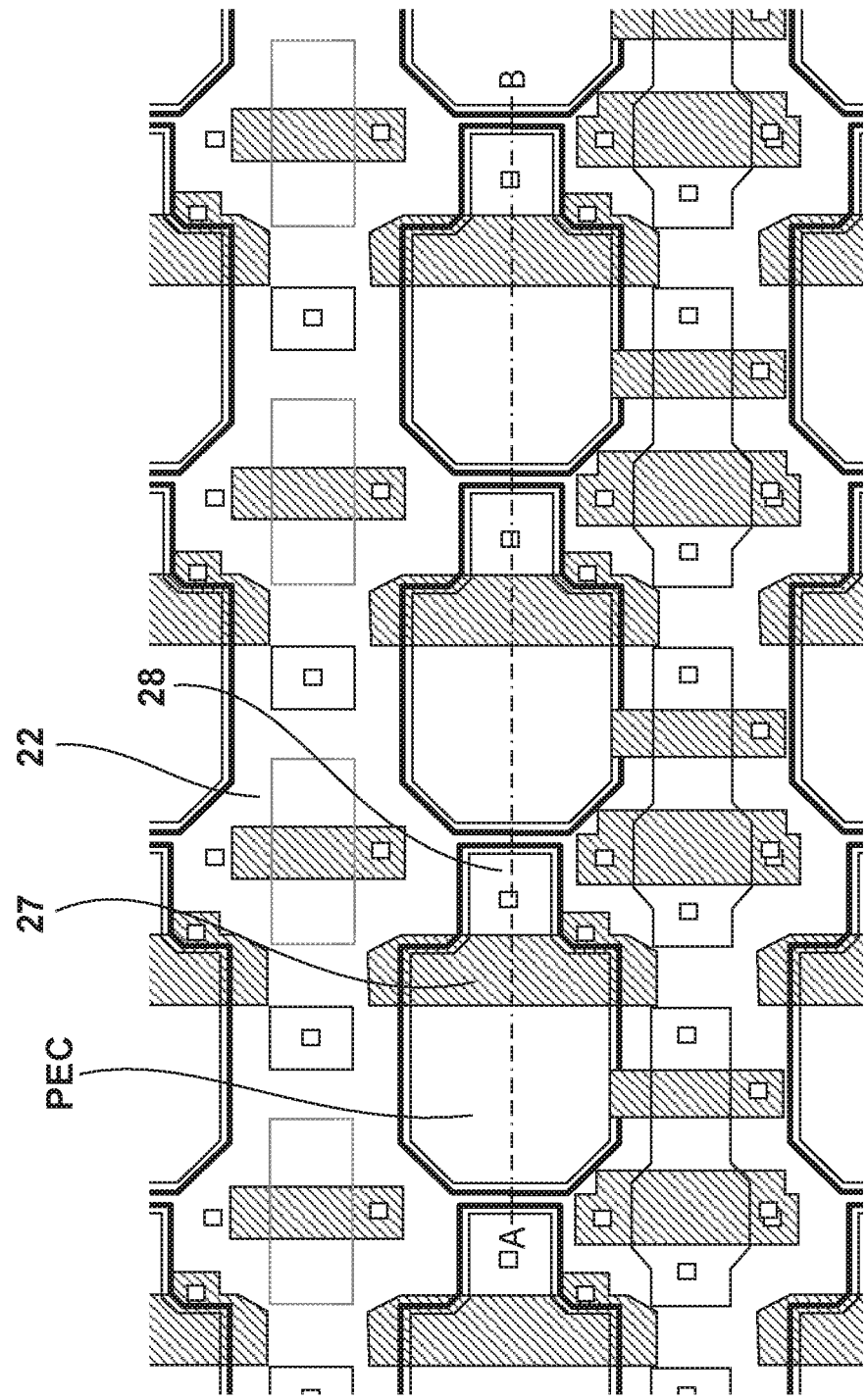
FIG. 2 is a plan view showing the portion of the pixel array of the solid-state image sensor of the first embodiment.
Figure 3:
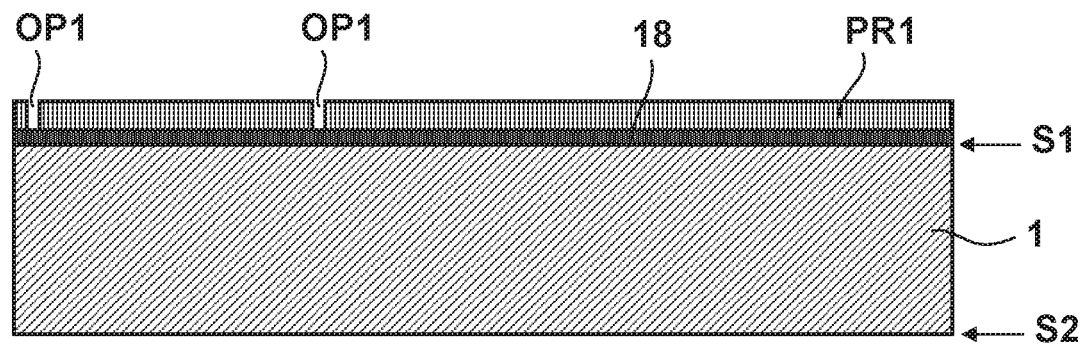
FIG. 3 is a sectional view for explaining a method of manufacturing the solid-state image sensor of the first embodiment.
Figure 3:
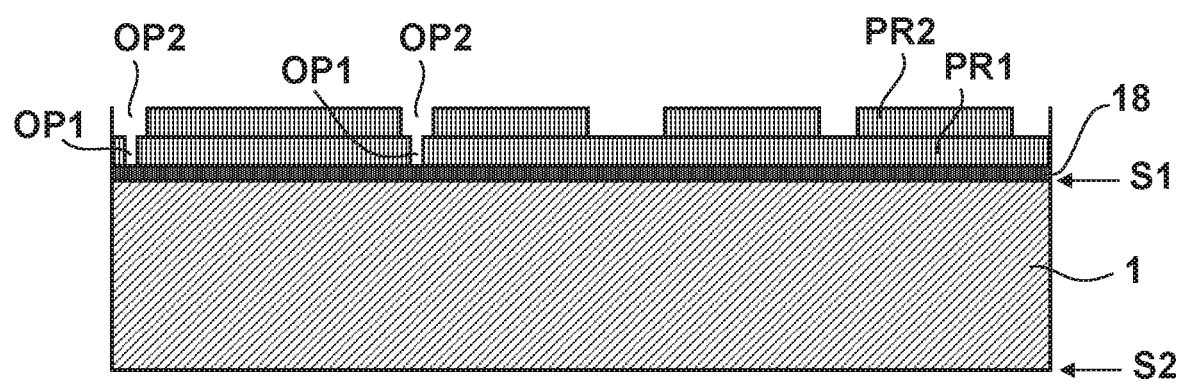
Figure 3:
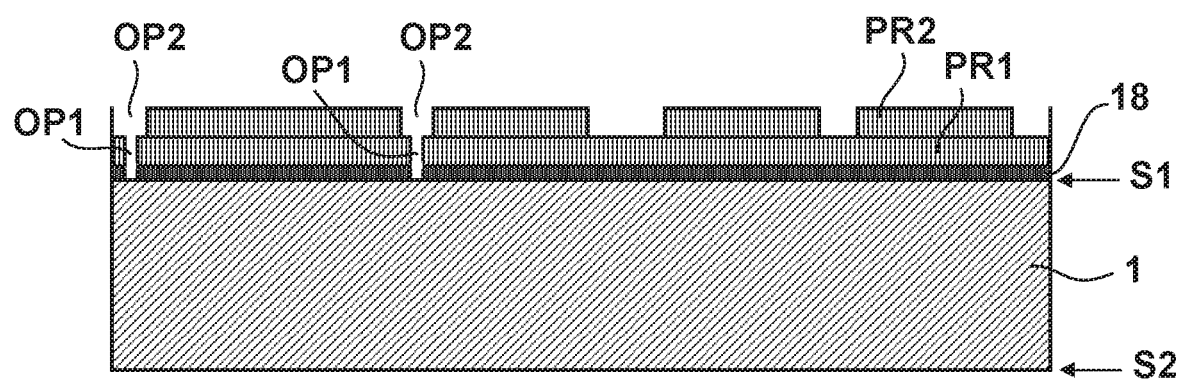
Figure 4:
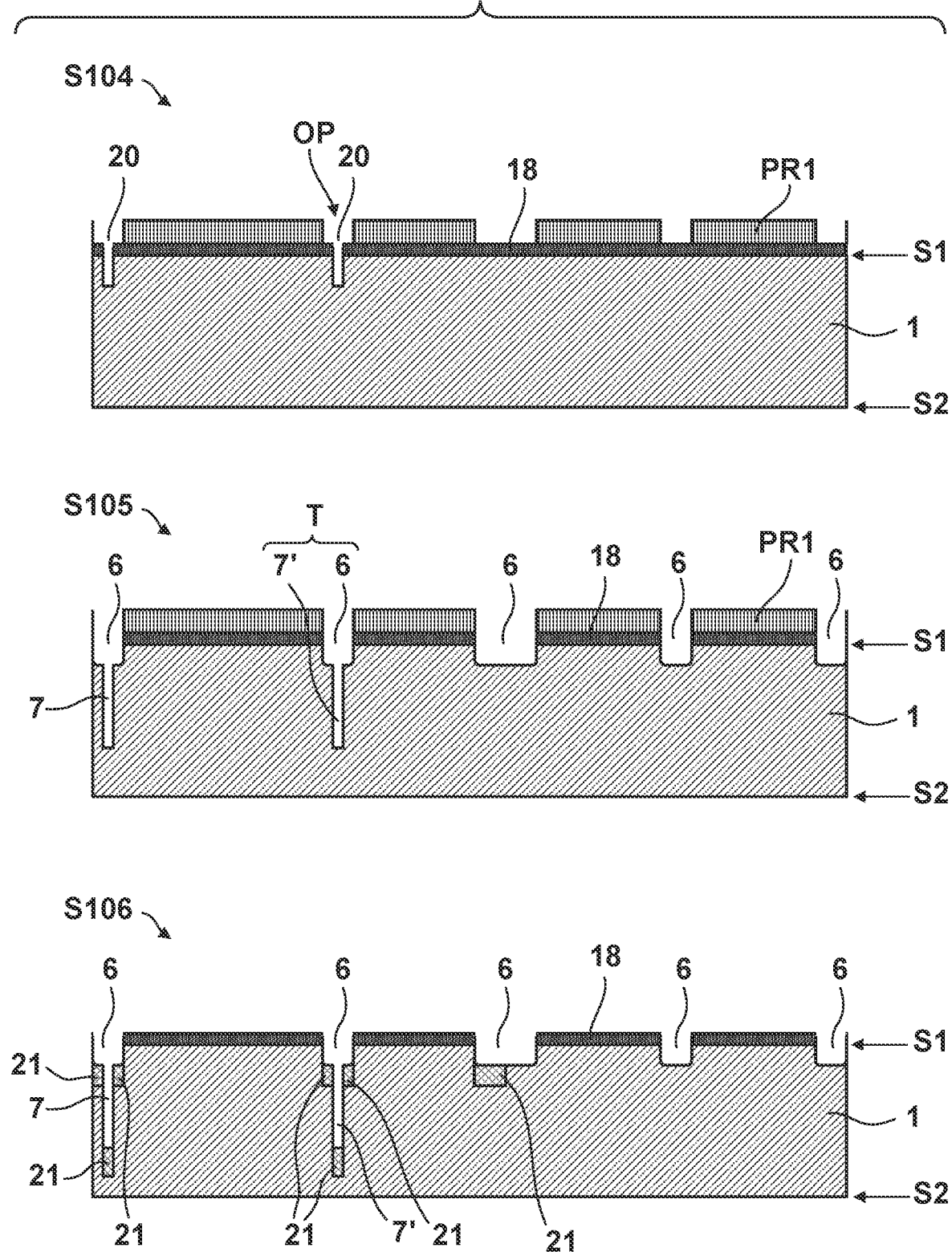
FIG. 4 is a sectional view for explaining the method of manufacturing the solid-state image sensor of the first embodiment.
Figure 5:
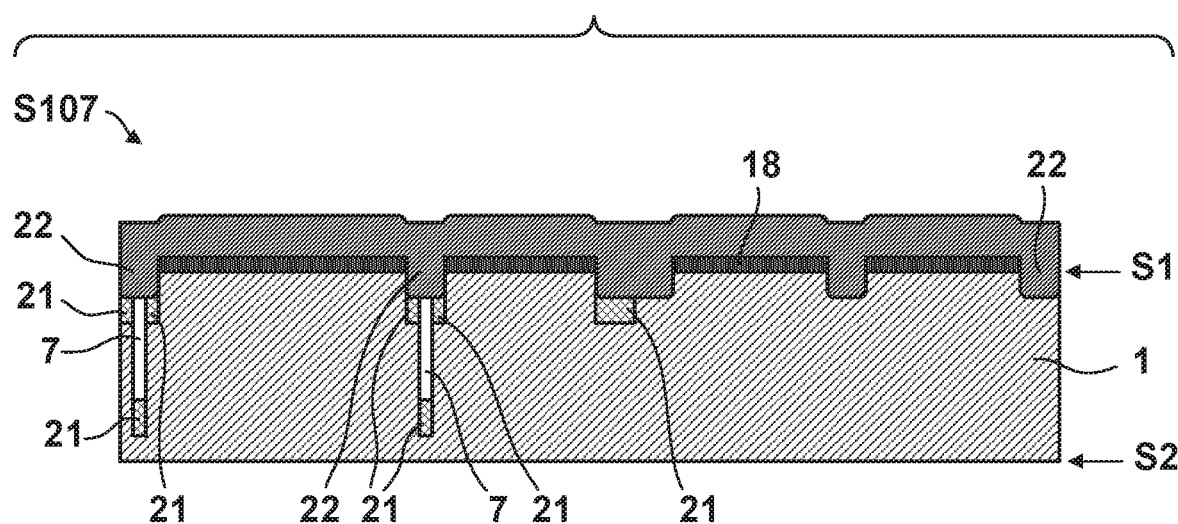
FIG. 5 is a sectional view for explaining the method of manufacturing the solid-state image sensor of the first embodiment.
Figure 5:
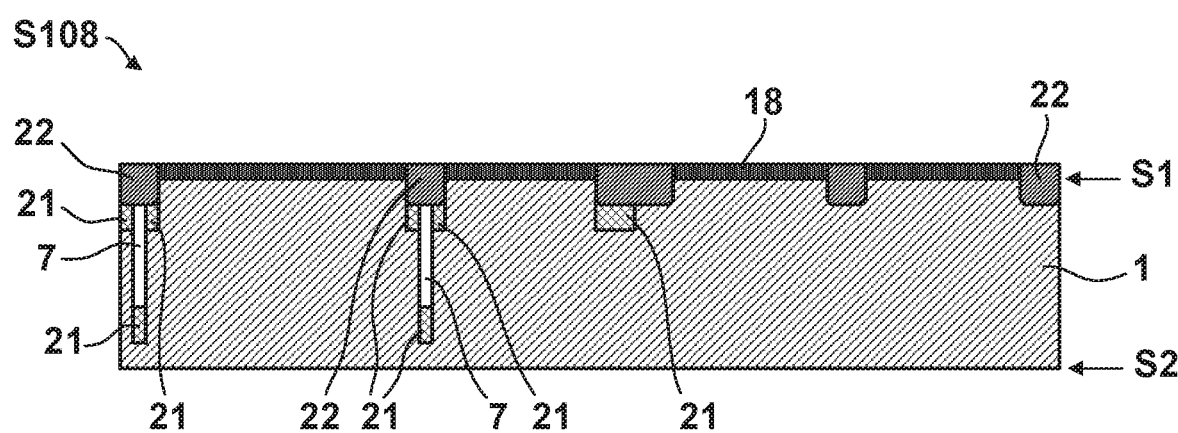
Figure 5:
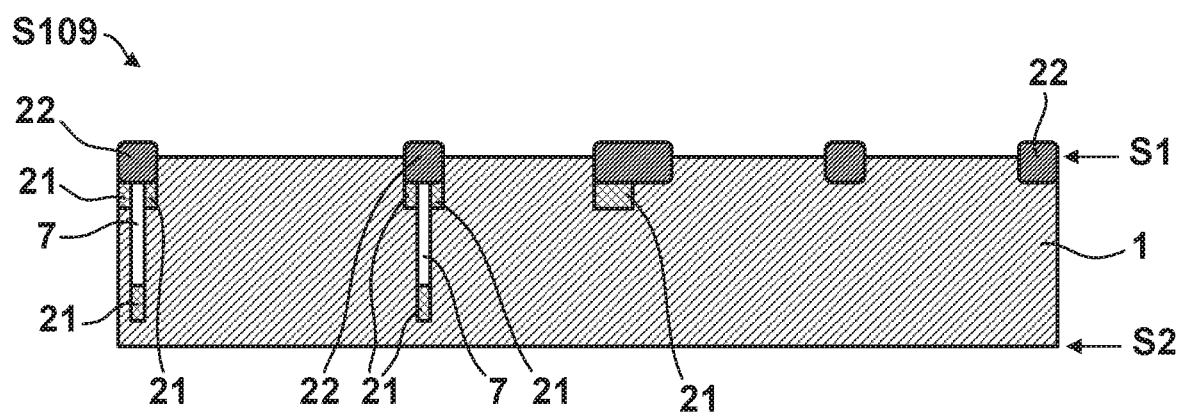

FIG. 1 is a sectional view showing a portion of a pixel array of a solid-state image sensor 100 of the first embodiment. FIG. 2 is a plan view showing the portion of the pixel array of the solid-state image sensor 100. Note that FIG. 1 is a schematic sectional view taken along a line A-B in FIG. 2, and shows three photoelectric converters PEC.

The solid-state image sensor 100 can include a semiconductor substrate 1 having a first face S1 and second face S2', an insulator 22 arranged on the side of the first face S1 of the semiconductor substrate 1, and a space 7 which is also called an air gap or just a gap, extending from the insulator 22 to the side of the second face S2' in the semiconductor substrate 1. The solid-state image sensor 100 can also include a plurality of elements formed between the first face S1 and second face S2'. The plurality of elements can include, for example, the photoelectric converters PEC, floating diffusions 28, and transfer gates 27. The plurality of elements can also include a reset transistor for resetting the potential of the floating diffusion 28, and an amplification transistor for outputting a signal corresponding to the potential of the floating diffusion 28 to a column signal line. The reset transistor and amplification transistor may be formed for each photoelectric converter PEC, and may also be shared by a plurality of photoelectric converters PEC or a plurality of pixels. Each pixel of the solid-state image sensor 100 includes at least one photoelectric converter PEC. The solid-state image sensor 100 can include channel stops 21 formed in positions adjacent to the insulators 22 and spaces 7.

The insulator 22 forms, for example, STI (Shallow Trench Isolation). The space 7 may be filled with a gas, and may also be maintained in a low-pressure state or vacuum state.

The insulator 22 and space 7 form element isolation for isolating elements. Isolation between elements can be, for example, isolation between adjacent photoelectric converters PEC. Alternatively, isolation between elements can be isolation between pixels. Furthermore, isolation between elements can be isolation between the photoelectric converter PEC and a transistor (for example, the reset transistor or amplification transistor) adjacent to each other. The width (the width in the horizontal direction in FIG. 1) of the space 7 in a direction in which adjacent elements of a plurality of elements (for example, the photoelectric converters PEC) are isolated is smaller than the width of the insulator 22 in the same direction. The width of the space 7 may be constant along the depth direction (a direction from the side of the first face S1 to the side of the second face S2') of the semiconductor substrate 1, and may also increase or decrease in the direction away from the first face S1. In the following description, the width means a dimension in the direction in which adjacent elements of a plurality of elements (for example, the photoelectric converters PEC) are isolated.

As exemplified in FIG. 2, the insulators 22 forming element isolation are so arranged as to surround the elements such as the photoelectric converters PEC. The spaces 7 forming this element isolation are also so arranged as to surround the elements such as the photoelectric converters PEC.

The photoelectric converter PEC can include, for example, a charge accumulation region 25 made of a first-conductivity-type semiconductor region, a first-conductivity-type semiconductor region 23 arranged in contact with the charge accumulation region 25, and a second-conductivity-type semiconductor region 24 arranged in contact with the semiconductor region 23. The photoelectric converter PEC may also include a second-conductivity-type semiconductor region 26 between the charge accumulation region 25 and first face S1. The second conductivity type is a p type when the first conductivity type is an n type, and an n type when the first conductivity type is a p type. The transfer gate 27 is a gate electrode. The transfer gate 27, charge accumulation region 25, and floating diffusion 28 form a MOS structure.

On the first-face side of the semiconductor substrate 1, a wiring structure including a plurality of interlayer insulation films 10 and a plurality of wiring layers 9 and a passivation film 11 formed on the wiring structure can be arranged. On the second-face side of the semiconductor substrate 1, a planarizing film 12, color filter layer 13, capping layer 14, and microlens layer 15 can be stacked. Note that a material forming the planarizing film 12 hardly enters the spaces 7.

The solid-state image sensor 100 exemplified in FIGS. 1 and 2 is a backside irradiation type solid-state image sensor designed such that light enters the side opposite to the first-face side on which the wiring structure is arranged, that is, enters the second-face side. Light having passed through the microlens of the microlens layer 15 enters the second face S2' of the semiconductor substrate 1 through the color filter layer 13, and generates an electric charge in the photoelectric converter PEC. The generated electric charge is accumulated in the charge accumulation region 25, and transferred to the floating diffusion 28 through a channel formed by the transfer gate 27. The potential of the floating diffusion 28 changes in accordance with the amount of transferred electric charge. The amplification transistor outputs a signal corresponding to the potential of the floating diffusion 28 to the column signal line.

When the semiconductor substrate 1 is made of silicon and the insulator 22 is made of silicon oxide, the refractive indices of the silicon oxide and space 7 are smaller than that of silicon. Accordingly, light having entered the photoelectric converter PEC is reflected by the interface between the space 7 and photoelectric converter PEC, and the interface between the insulator 22 and photoelectric converter PEC. Consequently, it is possible to reduce the penetration of light having entered the photoelectric converter PEC into the photoelectric converter PEC and/or the floating diffusion 28 of an adjacent pixel. This makes it possible to reduce a mixture of colors, and increase the resolution of an image.

A method of manufacturing the solid-state image sensor 100 will exemplarily be explained below with reference to FIGS. 3 to 7. FIGS. 3 to 7 illustrate the photoelectric converter PEC and transistors AT (for example, the reset transistor and amplification transistor) of one pixel, and portions corresponding to an NMOS transistor PTN and PMOS transistor PTP of a peripheral circuit.

Steps S101 to S105 are steps of forming a trench T including a space (first portion) 7 and second portion 6 by processing the first face S1 of the semiconductor substrate 1. The semiconductor substrate 1 is typically a silicon substrate and has the first face S1 and a second face S2.

In step S101, a laminated film 18 is formed on the first face of the semiconductor substrate 1. The laminated film 18 can include, for example, a silicon oxide film formed on the first face S1 of the semiconductor substrate 1, a polysilicon film formed on the silicon oxide film, and a silicon nitride film formed on the polysilicon film. The silicon oxide film can have a thickness of, for example, 5 to 30 nm, and can be formed by, for example, normal-pressure thermal oxidation. This thermal oxidation can be performed, for example, in oxygen or in a hydrogen/oxygen gas mixture at a temperature of 700° C. to 1,150° C. The polysilicon film can have a thickness of, for example, 10 to 100 nm, and can be deposited by, for example, using monosilane ($SiH_4$) at a temperature of 600° C. to 700° C. and a pressure of 5 to 100 Pa. The silicon nitride film can have a thickness of, for example, 30 to 200 nm, and can be deposited by using a gas mixture containing ammonia and monosilane or dichlorosilane ($Si_2H_2Cl_2$) at a temperature of 700° C. to 900° C. and a pressure of 5 to 100 Pa.

Also, in step S101, a first photoresist PR1 having first openings OP1 is further formed on the laminated film 18. The first photoresist PR1 having the first openings OP1 can be formed by a photolithography step. The first opening OP1 defines the region of the space (first portion) 7 (that is, a width and a dimension in a direction perpendicular to the width).

In step S102, a second photoresist PR2 having second openings OP2 is formed on the first photoresist PR1. The second photoresist PR2 having the second openings OP2 can be formed by a photolithography step. The second opening OP2 defines the region of the second portion 6 (that is, a width and a dimension in a direction perpendicular to the width).

In step S103, the laminated film 18 on the semiconductor substrate 1 is etched by using the first photoresist PR1 and second photoresist PR2 as etching masks. In step S104, the semiconductor substrate 1 is etched by using the first photoresist PR1 and second photoresist PR2 as etching masks.

As described previously, the laminated film 18 can include the silicon oxide film, polysilicon film, and silicon nitride film in this order from the side of the semiconductor substrate 1. The silicon nitride film can be, for example, plasma-etched by using a Freon-based gas such as methane tetrafluoride ($CF_4$), methane difluoride ($CH_2F_2$), methane trifluoride ($CHF_3$), or sulfur hexafluoride ($SF_6$). It is possible to use the Freon-based gas singly, by combining it with another Freon-based gas, and/or by mixing it with an inert gas such as argon or helium or with hydrogen.

The polysilicon film can be plasma-etched by using a gas mixture of hydrogen bromide (HBr)/chlorine ($Cl_2$)/oxygen. This gas mixture may also be used as it is mixed with an inert gas such as argon or helium. The silicon oxide film can be plasma-etched by mixing a Freon-based gas similar to that of the silicon nitride film with oxygen. It is possible to use this gas mixture singly, by combining it with another Freon-based gas, and/or by mixing it with an inert gas such as argon or helium.

In step S104, the semiconductor substrate 1 is etched through the first openings OP1, thereby forming trenches 20 corresponding to the width of the first openings OP1 in the semiconductor substrate 1. The tranches 20 are formed between a plane including the first face S1 and a plane including the second face S2. Also, in step S104, in addition to the formation of the trenches 20, those portions of the first photoresist PR1, which are exposed in the second openings OP2, are removed, thereby forming openings OP corresponding to the dimension of the second openings OP2 in the first photoresist PR1. In step S104, a Bosch process that performs etching by alternately supplying sulfur hexafluoride and Freon 318C ($C_4F_8$) by using an inductively coupled plasma (ICP) apparatus can be adopted. As an example, it is possible to set the width of the trench 20 at 0.1 μm, and the depth of the trench 20 at 3 to 5 μm. In step S104, it is also possible to perform plasma etching using a dipole ring magnetron (DRM) method by using a sulfur hexafluoride/oxygen gas mixture. In this case, only the resist pattern in an element formation region can be left behind by the resist etch back technique.

In step S105, the laminated film 18 and semiconductor substrate 1 are etched through the openings OP formed in the first photoresist PR1, thereby forming first portions 7' and second portions 6 in the semiconductor substrate 1. The first portions 7' are defined by the openings OP, and the second portions 6 are defined by the trenches 20. Therefore, the region of the first portion 7' (that is, a width and a dimension in a direction perpendicular to the width) is defined by the first opening OP1 formed in the first photoresist PR1. Also, the region of the second portion 6 (that is, a width and a dimension in a direction perpendicular to the width) is defined by the second opening OP2 formed in the second photoresist PR2. The etching conditions of the laminated film 18 can follow those of the laminated film 18 in step S103. The semiconductor substrate 1 can be, for example, plasma-etched by using a gas mixture of hydrogen bromide (HBr)/chlorine ($Cl_2$)/oxygen. This gas mixture may also be used as it is mixed with an inert gas such as argon or helium. The depth from the first face S1 to the bottom of the second portion 6 of the semiconductor substrate 1 can be set at, for example, 200 to 300 nm.

On at least a portion of the side surface of the trench T formed by the first portion 7' and second portion 6, it is possible to form a semiconductor region serving as a barrier against an electric charge to be accumulated in the charge accumulation region 25 of the photoelectric converter PEC.

In step S106, channel stops 21 are formed below the first portions 7'. The channel stops 21 can be formed by, for example, implanting ions for forming a second-conductivity-type semiconductor region by using the first photoresist PR1 as a mask. When the second conductivity type is a p type, the channel stops 21 can be formed by, for example, obliquely implanting boron ions into the semiconductor substrate 1 at an acceleration voltage of 25 keV, and a dose of $3.0 \times 10^{12}$ to $2.5 \times 10^{13}$ ions/cm$^2$. The channel stops 21 can also be formed below the second portions 6.

In step S107, an insulator 22 is filled in the second portions 6 so that the spaces 7 remain in the first portions 7' and the trenches T are closed. In other words, in step S107, the insulator 22 that covers the first portions 7' is formed in the second portions 6. That is, the insulator 22 formed in the second portions 6 is the cover of the first portion 7'. Before the insulator 22 is filled in the second portions 6, an oxidation process may also be performed in order to smooth the edges in the trenches T. As this oxidation process, it is possible to apply, for example, radical oxidation performed in a hydrogen/oxygen gas mixture at a temperature of 900° C. to 1,100° C. and a pressure of 0.8 to 2.0 kPa, or thermal oxidation performed in normal-pressure oxygen. The insulator 22 is, for example, silicon oxide, and can be filled by, for example, a high-density plasma CVD technique. More specifically, the insulator 22 can be filled in a monosilane/oxygen/helium gas mixture at a temperature of 550° C. to 700° C. and a pressure of 0.4 to 1.3 Pa by using an ICP apparatus. Under the conditions, almost no silicon oxide film is formed inside the trenches T, and silicon oxide as the insulator 22 is deposited on the trenches T while the interiors of the trenches T are kept in a low-pressure state. To leave the space 7 behind without filling the insulator 22 inside the first portion 7', it is favorable to, for example, set the aspect ratio (height/width) of the first portion 7' at 30 to 50, and the width of the first portion 7' on a submicron order. The thickness of the insulator 22 can be set at, for example, 500 to 800 nm on the laminated film 18.

In step S108, the insulator (silicon oxide) 22 is planarized as it is removed from the surface of the laminated film 18. In this step, after the insulator 22 is plasma-etched, annealing can be performed in a nitrogen ambient at a temperature of 900° C. for 20 to 90 min. Consequently, it is possible to stabilize the characteristics by thermally tightening the insulator (silicon oxide) 22, and activate the channel stops 21. After that, the insulator (silicon oxide) 22 can be planarized by two-step CMP (Chemical Mechanical Polish) using silica and ceria as polishing agents.

In step S109, the surface (first face S1) of the semiconductor substrate 1 in the element formation region is exposed by removing the laminated film 18. The same conditions as in step S103 can be adopted to remove the laminated film 18.

Figure 6:
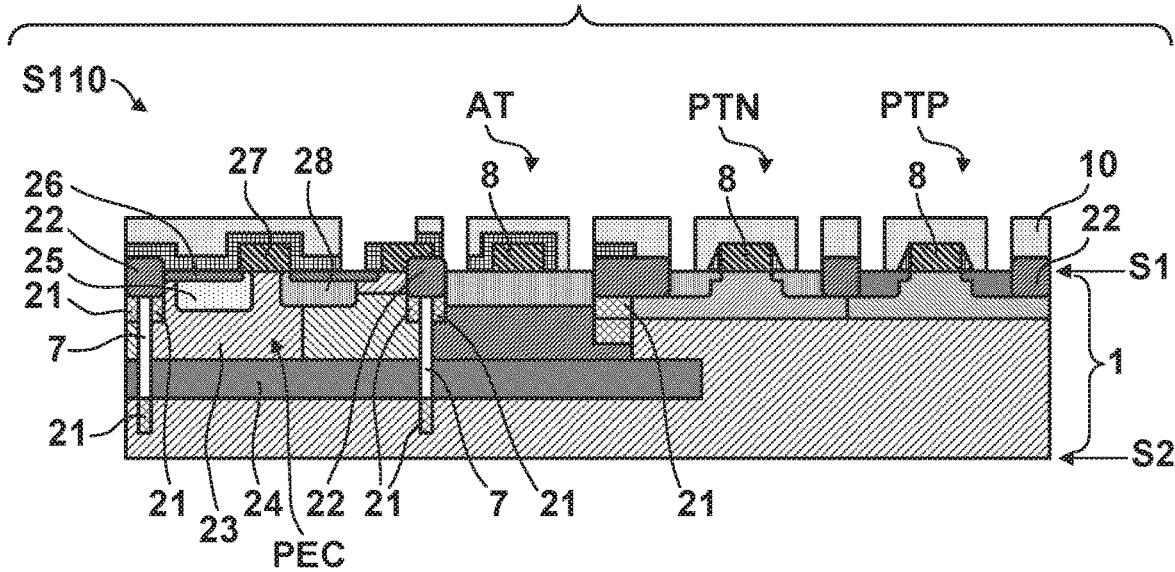
FIG. 6 is a sectional view for explaining the method of manufacturing the solid-state image sensor of the first embodiment.
Figure 6:
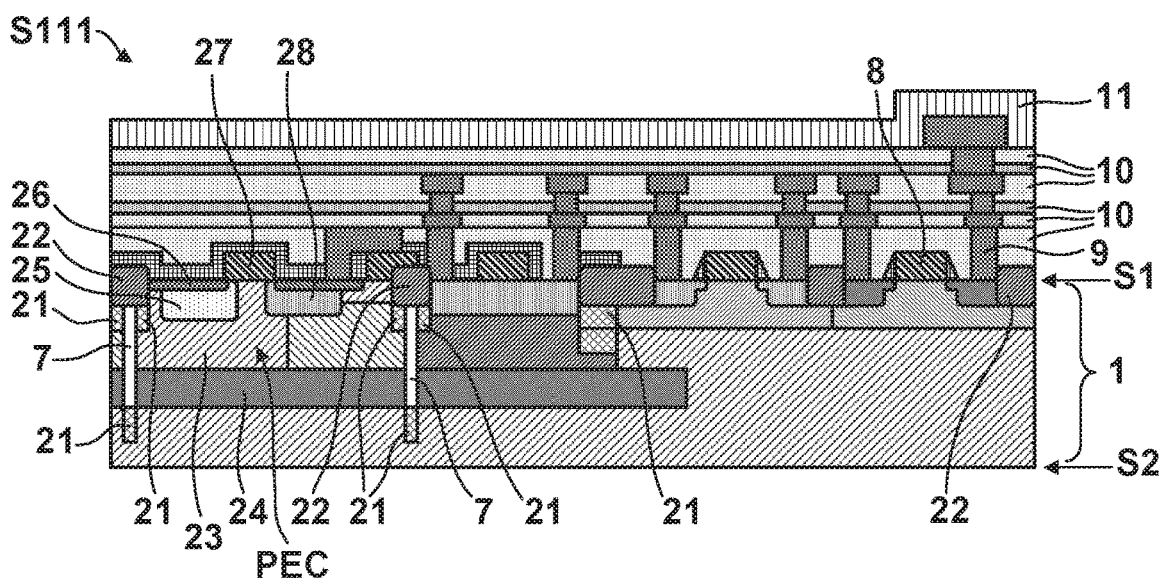
Figure 6:
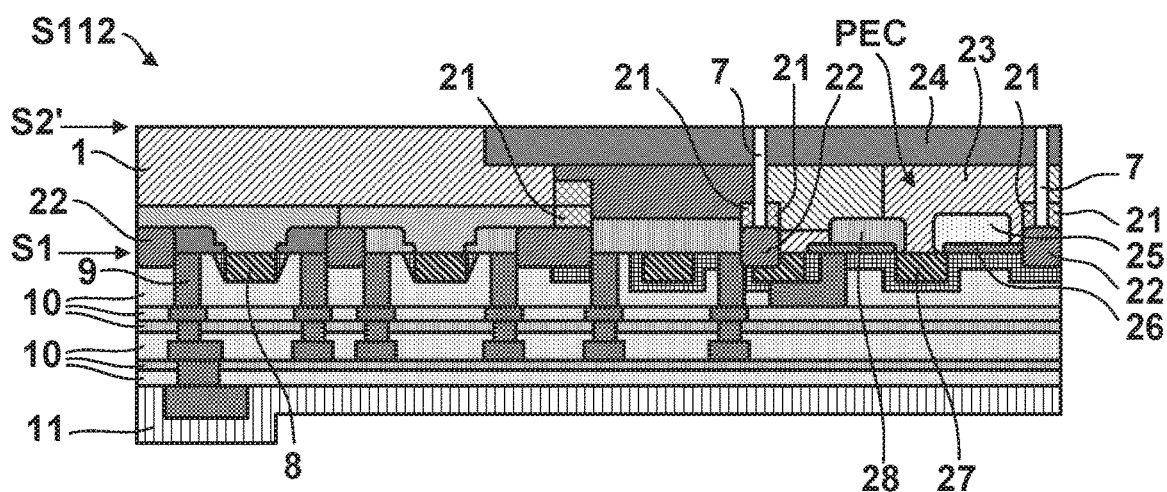
Figure 7:
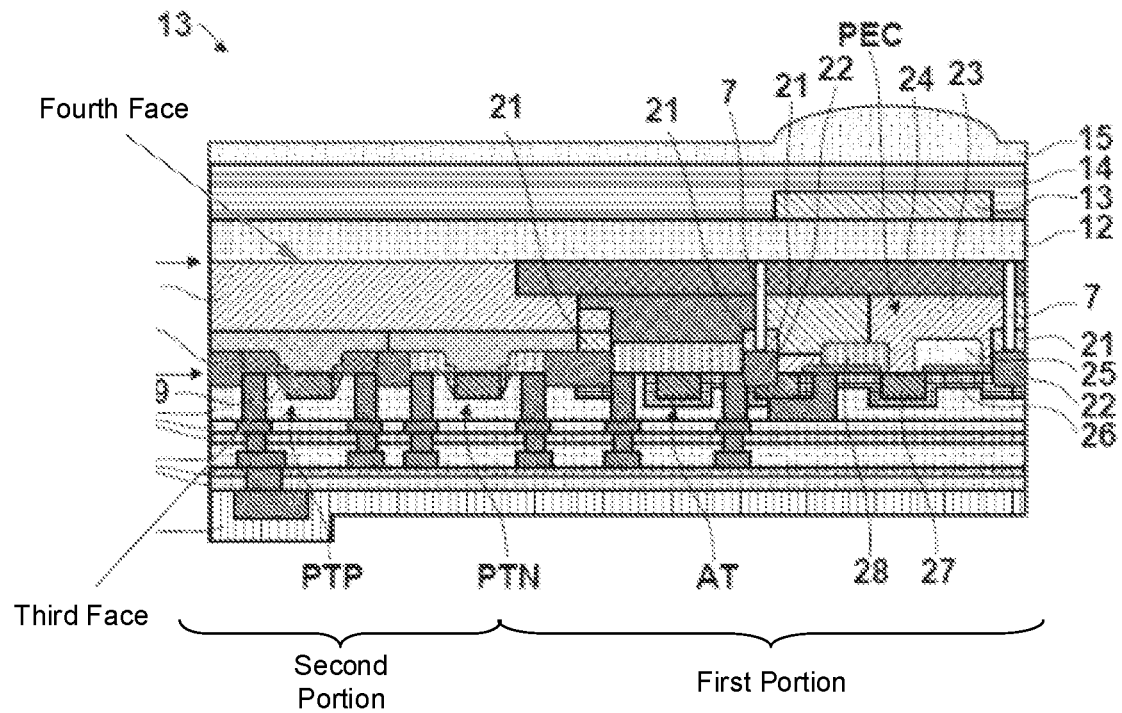
FIG. 7 is a sectional view for explaining the method of manufacturing the solid-state image sensor of the first embodiment.

In step S110, an element is formed between the first face S1 and second face S2 of the semiconductor substrate 1. A portion of the element may be formed on the first face S1. Also, another element may be formed on the first face S1. As elements forming a pixel, FIG. 6 shows the photoelectric converter PEC, transfer gate 27, floating diffusion 28, and transistor AT (for example, the reset transistor and amplification transistor). FIG. 6 also shows the NMOS transistor PTN and PMOS transistor PTP in the peripheral circuit. That is, FIG. 6 shows the gates 8 of the transistor AT, NMOS transistor PNT, and PMOS transistor PTP. The elements can be formed by, for example, an FEOL (Front-End Of Line) process. In step S110, an interlayer insulation film 10 of the first layer is further formed.

In step S111, a wiring structure including a plurality of interlayer insulation films 10 and a plurality of wiring layers 9 is completed, and a passivation film 11 is formed on the wiring structure. The wiring layers 9 can be formed by, for example, Cu. The interlayer insulation films 10 can include a Cu diffusion preventing film or a silicon nitride film serving as an etching stopper, in addition to a silicon oxide film. The wiring layers 9 may also be formed by a material other than Cu, for example, Al.

In step S112, the semiconductor substrate 1 is thinned from the side of the second face S2 so as to expose the spaces 7. The semiconductor substrate 1 can be thinned by, for example, polishing by a grinder, or CMP. It is also possible to apply a well-known substrate thinning technique adopted in three-dimensional packaging or TSV (Through-Silicon Via) formation process. The second face after the thinning is indicated by a second face S2'.

The thinning can be performed in a state in which a support substrate containing a resin such as plastic, glass, or silicon as a main material is bonded to the side of the first face S1 of the semiconductor substrate 1. The support substrate can be bonded to the semiconductor substrate 1 by using an adhesive such as an epoxy resin. When using an adhesive for bonding the support substrate to the semiconductor substrate 1, the semiconductor substrate 1 is preferably thinned after the wiring structure is formed.

In step S113, a light-transmitting planarizing film 12, color filter layer 13, capping layer 14, and microlens layer 15 are formed on the side of the second face S2' of the semiconductor substrate 1.

The solid-state image sensor 100 as an example of a semiconductor device is obtained through the manufacturing method described above. In this manufacturing method, the alignment of element isolation formed by the spaces 7 and insulators 22 and the alignment of the photoelectric converters PEC and the elements such as the transistors can be performed by using alignment marks formed on the same face (first face S1) of the semiconductor substrate 1. This is advantageous for high integration because the margin required for the layout can be decreased.

Figure 8:
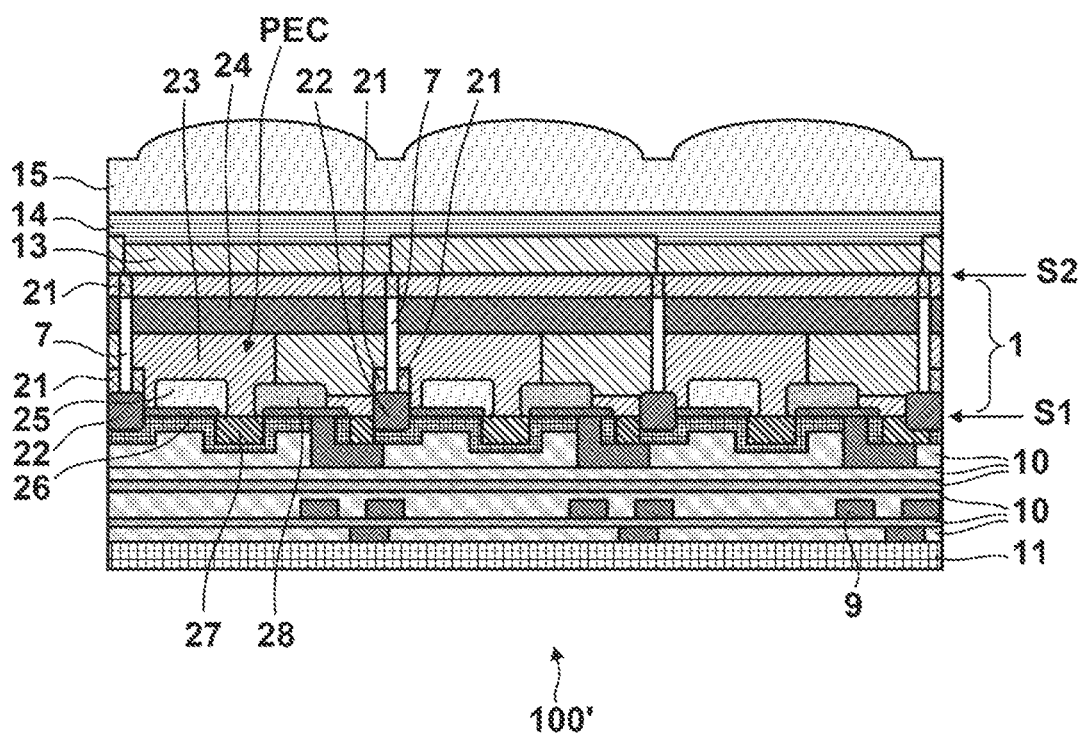
FIG. 8 is a sectional view showing a portion of a pixel array of a solid-state image sensor of the second embodiment.

The second embodiment of the present invention will be explained below. Note that matters not mentioned in the second embodiment can follow the first embodiment. FIG. 8 is a sectional view showing a portion of a pixel array of a solid-state image sensor 100' of the second embodiment. In the solid-state image sensor 100' of the second embodiment, spaces 7 (first portions) do not reach a second face S2 of the semiconductor substrate 1, and a planarizing film 12 is omitted. In the second embodiment, no element isolation by the space 7 is performed between the second face S2 and the end portion of the space 7 on the side of the second face S2. However, a photoelectric converter PEC and floating diffusion 28 in a pixel are isolated from another pixel by the space 7 and insulator 22.

Figure 9:
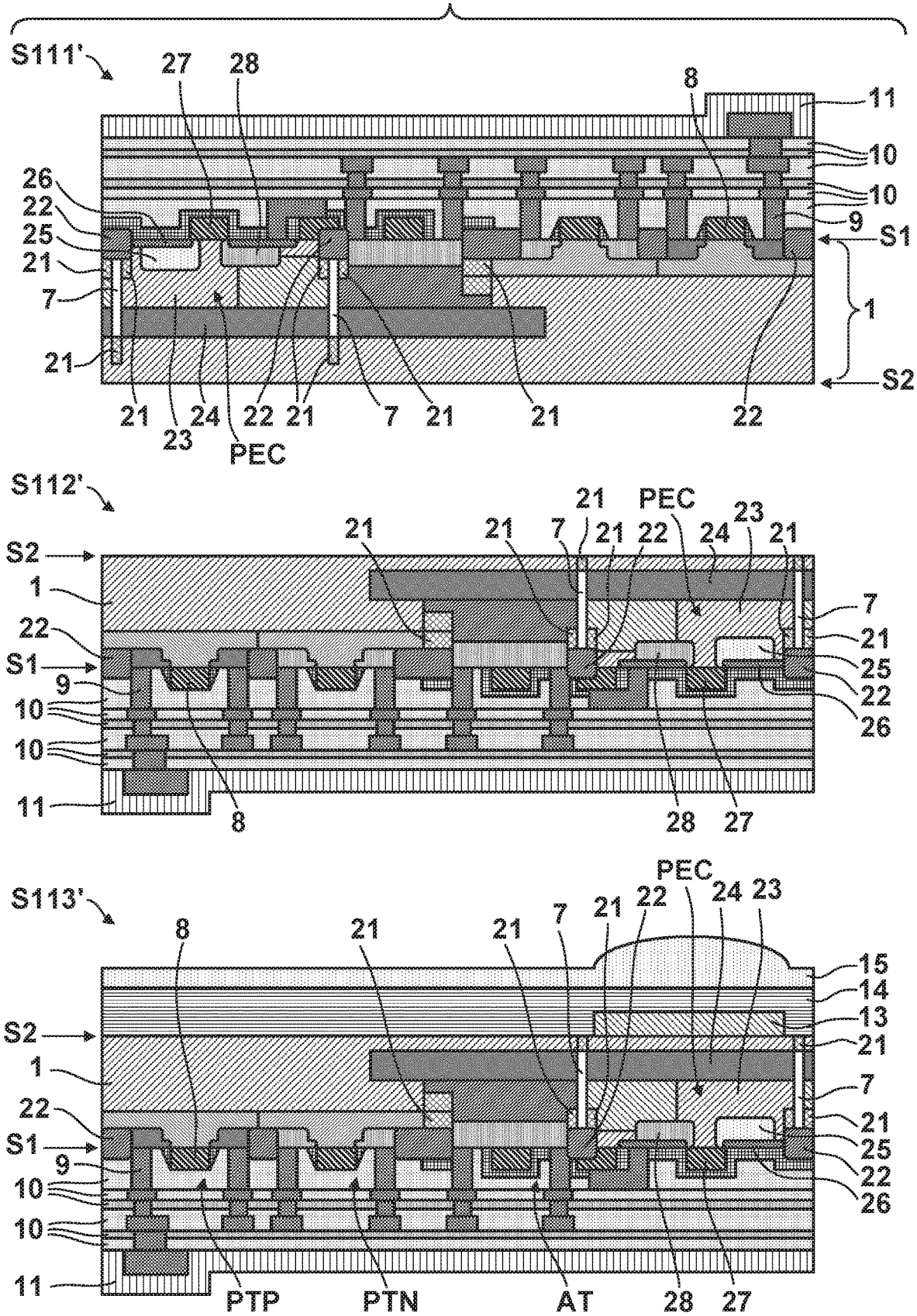
FIG. 9 is a sectional view for explaining a method of manufacturing the solid-state image sensor of the second embodiment.

A method of manufacturing the solid-state image sensor 100 will exemplarily be explained below with reference to FIG. 9. FIG. 9 shows the photoelectric converter PEC and transistors AT (for example a reset transistor and amplification transistor) of one pixel, and portions corresponding to an NMOS transistor PTN and PMOS transistor PTP in a peripheral circuit.

Processing until the end of step S111' is the same as that until the end of step S111 in the first embodiment. In step S112', the semiconductor substrate 1 is thinned from the side of the second face S2, but the spaces 7 are not exposed. This thinning can be stopped when, for example, channel stops 21, which exist on the side of the second face S2, of the spaces 7 are exposed. The final thickness (the thickness after the thinning) of the semiconductor substrate 1 can suitably be set in accordance with a purpose, for example, securing the flatness when performing a process of forming the color filter layer 13. The thinning can be performed in a state in which a support substrate is bonded to the semiconductor substrate 1.

In step S113, a color filter layer 13, capping layer 14, and microlens layer 15 are formed on the side of the second face S2' of the semiconductor substrate 1. In the second embodiment, no planarizing film 12 needs to be formed because the spaces 7 are not exposed in the thinning step.

As an application example of the solid-state image sensor according to each of the above-mentioned embodiments, a camera incorporating the solid-state image sensor will exemplarily be explained below. The concept of the camera includes not only an apparatus whose main purpose is imaging, but also an apparatus (for example, a personal computer or portable terminal) having an imaging function as an auxiliary function. The camera includes the solid-state image sensor according to the present invention exemplified as the above-mentioned embodiments, and a processing unit that processes an output signal from the solid-state image sensor. This processing unit can include an A/D converter, and a processor that processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A semiconductor device comprising:
   a semiconductor layer having a first face and a second face opposite to the first face;
   a wiring layer arranged on a side of the first face of the semiconductor layer;
   a first separation including a first trench extending from the first face, and a second trench having a width narrower than a width of the first trench and extending between the first trench and the second face, wherein an edge of the second trench is situated in the second face;
   a second separation including a third trench extending from the first face, and a portion of the semiconductor layer, which covers an entire region of a bottom face of the third trench, and which extends to the second face; and
   a microlens layer,
   wherein the semiconductor layer includes a first portion in which a plurality of pixels are arranged, and a second portion situated between the first portion and an end of the semiconductor layer,
   wherein the first separation is arranged in the first portion, and the second separation is arranged in the second portion, and
   wherein a part of the semiconductor layer in the second portion is arranged between the microlens layer and the third trench.

2. The device according to claim 1, wherein a second transistor and a third transistor are arranged in the second portion, and
   wherein the second separation is situated between the second transistor and the third transistor.

3. The device according to claim 2, wherein the plurality of pixels includes a first pixel, and the first pixel has a first photoelectric converter and a first transistor.

4. The device according to claim 3, wherein the semiconductor layer includes a first semiconductor region where the first transistor is arranged, a second semiconductor region where the second transistor is arranged, and a third semiconductor region where the third transistor is arranged,
wherein a distance from an end of the first semiconductor region at a side of the second face to the first face is larger than a distance from an end of the second semiconductor region at a side of the second face to the first face, and a distance from an end of the third semiconductor region at a side of the second face to the first face.

5. The device according to claim 4, wherein a p-type semiconductor region is arranged between the first trench and the second face, the p-type semiconductor region being formed with a dose of $3.0 \times 10^{12}$ to $2.5 \times 10^{13}$ ions/cm$^2$.

6. A camera comprising:
the semiconductor device according to claim 5; and
a processor configured to process a signal from the semiconductor device.

7. A semiconductor device comprising:
a first semiconductor portion having a first face and a second face opposite to the first face, and having a pixel array;
a second semiconductor portion different from the first semiconductor portion and having a third face and a fourth face opposite to the third face;
a first transistor arranged in the second semiconductor portion;
a wiring layer arranged on a side of the first face of the first semiconductor portion and a side of the third face of the second semiconductor portion; and
a microlens layer,
wherein the first semiconductor portion has a first separation including a first trench extending from the first face, and a second trench having a width narrower than a width of the first trench and extending between the first trench and a first region of the second face, and an edge of the second trench is situated in the second face,
wherein the second semiconductor portion has a second separation including a third trench extending from the third face, and a portion of the second semiconductor portion, which covers an entire region of a bottom face of the third trench, and which extends to the fourth face, and
wherein the portion of the second semiconductor portion is arranged between the microlens layer and the third trench.

8. The device according to claim 7, wherein:
the first semiconductor portion includes a second transistor configured to read out a signal from a photoelectric converter;
the second semiconductor portion includes a third transistor;
the second transistor is an amplification transistor or a reset transistor;
the first transistor is a p-type transistor; and
the third transistor is an n-type transistor.

9. The device according to claim 8, wherein:
the first semiconductor portion includes a first semiconductor region provided with the second transistor;
the second semiconductor portion includes a second semiconductor region provided with the first transistor; and
a distance from an end of the first semiconductor region at a side of the second face to the first face is larger than a distance from an end of the second semiconductor region at a side of the fourth face to the third face.

10. A camera comprising:
the semiconductor device as defined in claim 7; and
a processor configured to process a signal from the semiconductor device.

11. A semiconductor device comprising:
a first semiconductor portion having a first face and a second face opposite to the first face, and having a first photoelectric converter and a second photoelectric converter arranged in the first semiconductor portion;
a second semiconductor portion having a third face and a fourth face opposite to the third face, having a first transistor and a second transistor arranged in the second semiconductor portion, the second semiconductor portion being different from the first semiconductor portion;
a wiring layer arranged on a side of the first face of the first semiconductor portion and a side of the third face of the second semiconductor portion; and
a microlens layer,
wherein the first semiconductor portion has a trench arranged between the first photoelectric converter and the second photoelectric converter, extending between the first face and the second face, and an edge of the trench is situated in the second face,
wherein the second semiconductor portion has a semiconductor region that continuously extends from a position below the first transistor to a position below the second transistor, and that extends to the fourth face, and
wherein the semiconductor region is arranged between the microlens layer and the first transistor.

12. The device according to claim 11, wherein the first semiconductor portion includes a third transistor configured to read out a signal from the first photoelectric converter.

13. The device according to claim 12, wherein:
the first semiconductor portion includes a first semiconductor region provided with the third transistor;
the second semiconductor portion includes a second semiconductor region provided with the first transistor; and
a distance from an end of the first semiconductor region at a side of the second face to the first face is larger than a distance from an end of the second semiconductor region at a side of the fourth face to the third face.

14. The device according to claim 11, wherein:
the second transistor is a p-type transistor; and
the first transistor is an n-type transistor.

15. A camera comprising:
the semiconductor device as defined in claim 1; and
a processor configured to process a signal from the semiconductor device.

16. The device according to claim 3, wherein
the first transistor is an amplification transistor configured to amplify the signal from the first photoelectric converter, or a reset transistor.

17. The device according to claim 1, further comprising a layer arranged between the second trench and the microlens layer.

18. The device according to claim 1,
wherein the semiconductor layer includes a p-type transistor, an n-type transistor, and a semiconductor region in the second portion,
wherein the second separation is arranged between the p-type transistor and the n-type transistor,
wherein the semiconductor region continuously extends from a position below the p-type transistor to a position below the n-type transistor, and
wherein the semiconductor region is arranged between the microlens layer and the second separation.

19. The device according to claim 7, wherein the first semiconductor portion and the second semiconductor portion are arranged in a semiconductor layer.

20. The device according to claim 11, wherein the first semiconductor portion and the second semiconductor portion are arranged in a semiconductor layer.

21. The device according to claim 1, wherein a trench having an edge included in the second face is not arranged in the second separation.

22. The device according to claim 7, wherein a trench having an edge included in the fourth face is not arranged in the second separation.

23. The device according to claim 11, wherein a trench having an edge included in the fourth face is not arranged in a region including the first transistor and the second transistor.

* * * * *